(12) United States Patent
Zhang et al.

(10) Patent No.: US 12,356,679 B2
(45) Date of Patent: Jul. 8, 2025

(54) TRENCH GATE POWER MOSFET AND MANUFACTURING METHOD THEREFOR

(71) Applicant: INVENTCHIP TECHNOLOGY CO., LTD., Shanghai (CN)

(72) Inventors: Yongxi Zhang, Shanghai (CN); Wei Chen, Shanghai (CN); Haitao Huang, Shanghai (CN)

(73) Assignee: INVENTCHIP TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 18/869,453

(22) PCT Filed: Jun. 28, 2023

(86) PCT No.: PCT/CN2023/103303
§ 371 (c)(1),
(2) Date: Nov. 26, 2024

(87) PCT Pub. No.: WO2024/021977
PCT Pub. Date: Feb. 1, 2024

(65) Prior Publication Data
US 2025/0169129 A1 May 22, 2025

(30) Foreign Application Priority Data

Jul. 27, 2022 (CN) .......................... 202210888034.3

(51) Int. Cl.
*H10D 62/10* (2025.01)
*H10D 30/01* (2025.01)
(Continued)

(52) U.S. Cl.
CPC ....... *H10D 62/111* (2025.01); *H10D 30/0297* (2025.01); *H10D 30/668* (2025.01); *H10D 62/054* (2025.01); *H10D 62/8325* (2025.01)

(58) Field of Classification Search
CPC ............. H10D 30/668; H10D 30/0297; H10D 62/111; H10D 62/8325; H10D 62/054
(Continued)

(56) References Cited

U.S. PATENT DOCUMENTS

2013/0062629 A1\* 3/2013 Hiyoshi .............. H01L 21/3065
257/77
2017/0345891 A1 11/2017 Van Brunt et al.
(Continued)

FOREIGN PATENT DOCUMENTS

| CN | 111276540 A | 6/2020 |
| CN | 112017954 A | 12/2020 |

(Continued)

OTHER PUBLICATIONS

First Office Action; China National Intellectual Property Administration; Chinese Patent Application No. 202210888034.3; Sep. 29, 2022; 9 pages.
(Continued)

*Primary Examiner* — Igwe U Anya
(74) *Attorney, Agent, or Firm* — Taft Stettinius & Hollister LLP

(57) ABSTRACT

A trench gate power MOSFET, including: a substrate provided with a hexagonal wide bandgap semiconductor of a first conductivity type; an epitaxial layer grown on the substrate and of the first conductivity type; a body region formed on the epitaxial layer and of a second conductivity type; a trench formed in the body region by etching, where a length direction of the trench is parallel to a projection, on the surface of a wafer, of the C axis; a second conductivity-type pillar formed by implanting first ions into a bottom region of the trench along the C axis of the hexagonal wide bandgap semiconductor material, where the bottom region of the trench is located below the trench, and is connected
(Continued)

to the bottom of the trench, and the longitudinal depth of the second conductivity-type pillar is at least not less than 50% of the thickness of the epitaxial layer located in the bottom region of the trench; and a trench gate formed by filling the trench with a filler.

17 Claims, 11 Drawing Sheets

(51) Int. Cl.
  *H10D 30/66* (2025.01)
  *H10D 62/00* (2025.01)
  *H10D 62/832* (2025.01)

(58) Field of Classification Search
  USPC .......................................................... 257/493
  See application file for complete search history.

(56) References Cited

U.S. PATENT DOCUMENTS

| | | |
|---|---|---|
| 2018/0350976 A1 | 12/2018 | Okumura |
| 2019/0198622 A1* | 6/2019 | Uchida ............... H10D 62/8325 |
| 2019/0371889 A1* | 12/2019 | Narita .................. H10D 30/668 |

FOREIGN PATENT DOCUMENTS

| | | | |
|---|---|---|---|
| CN | 115084236 A | | 9/2022 |
| JP | 2009302510 A | * | 12/2009 ....... H01L 21/02378 |

OTHER PUBLICATIONS

Notification to Grant of Invention Patent; China National Intellectual Property Administration; Chinese Patent Application No. 202210888034.3; Oct. 13, 2022; 4 pages.

International Search Report; China National Intellectual Property Administration; International Application No. PCT/CN2023/103303; Aug. 24, 2023; 7 pages.

* cited by examiner

TRENCH GATE POWER MOSFET AND MANUFACTURING METHOD THEREFOR

CROSS REFERENCE TO RELATED APPLICATIONS

This application is a U.S. national stage filing of International Patent Application No. PCT/CN2023/103303 filed Jun. 28, 2023, which claims priority to Chinese Patent Application No. 202210888034.3 filed on Jul. 27, 2022, the contents of each application are hereby incorporated by reference in their entirety.

TECHNICAL FIELD

The present application relates to the field of semiconductors, and in particular, to a trench gate power MOSFET and a manufacturing method therefor.

BACKGROUND

Semiconductor devices such as power MOSFETs have been widely used in fields such as automotive electronics, switch-mode power supplies, and industrial control. In order to continuously improve power conversion efficiency and power density, it is crucial to design efficient power switching devices such as power MOSFETs. The most important performance parameter of a power MOSFET is the specific on-resistance Rsp. The on-resistance between the drain and the source is proportional to the power consumed by the power MOSFET device. Under the same breakdown voltage, for devices with the same on-resistance, the smaller the specific on-resistance, the smaller the chip area, and the lower the parasitic capacitance of the power MOSFET, thereby reducing the switching loss of the power MOSFET during power conversion. Power devices with trench gate and super junction structures have lower on-resistance, resulting in lower switching losses and faster switching speeds, making them one of the most widely used power switching devices. However, currently, the manufacturing cost of the power devices with trench gate and super junction structures is high, and the process control is difficult.

SUMMARY

In order to solve the above problems in the prior art, the present invention provides a trench gate power MOSFET and a manufacturing method therefor.

According to a first aspect, the present invention provides a trench gate power MOSFET, where the trench gate power MOSFET is formed in a wafer, including:
  a substrate, where the substrate is a substrate of a wide bandgap semiconductor material having a first conductivity type;
  an epitaxial layer, where the epitaxial layer is grown on the substrate and has the first conductivity type;
  a body region, where the body region is formed on the epitaxial layer and has a second conductivity type;
  a trench, where the trench is formed in the body region by etching, the length direction of the trench is parallel to a projection, on the surface of the wafer, of a crystallographic direction with the most obvious channel effect among all crystallographic directions of the wafer;
  a second conductivity-type pillar, where the second conductivity-type pillar is formed by implanting first ions into a bottom region of the trench along the crystallographic direction with the most obvious channel effect of the wide bandgap semiconductor material, the bottom region of the trench is located below the trench, and is connected to the bottom of the trench, and the longitudinal depth of the second conductivity-type pillar is not less than 50% of the thickness of the epitaxial layer located in the bottom region of the trench; and
  a trench gate, where the trench gate is formed by filling the trench with a filler.

According to a possible implementation of the first aspect, the trench gate power MOSFET further includes: a connector having the second conductivity type is further provided between the second conductivity-type pillar and the body region, one end of the connector is electrically connected to the body region, and the other end of the connector is electrically connected to the second conductivity-type pillar.

In a possible implementation of the first aspect, the trench gate power MOSFET further includes: a drain located below the substrate, a gate located on the central axis of the body region, and a source located on both sides of the gate.

In a possible implementation of the first aspect, the trench gate power MOSFET further includes: the epitaxial layer is a single epitaxial layer.

In a possible implementation of the first aspect, the trench gate power MOSFET further includes: the epitaxial layer includes a first epitaxial layer and a second epitaxial layer, and the first epitaxial layer is located below the second epitaxial layer; the thickness of the first epitaxial layer is less than the thickness of the second epitaxial layer; the doping concentration of the first epitaxial layer is less than the doping concentration of the second epitaxial layer; the bottom of the trench and the second conductivity-type pillar are located in the second epitaxial layer, and the longitudinal depth of the second conductivity-type pillar is not less than 50% of the thickness of the second epitaxial layer located in the bottom region of the trench.

In a possible implementation of the first aspect, the trench gate power MOSFET further includes: the wide bandgap semiconductor material is silicon carbide.

In a possible implementation of the first aspect, the trench gate power MOSFET further includes: the silicon carbide includes 4H—SIC or 6H—SIC.

In a possible implementation of the first aspect, the trench gate power MOSFET further includes: the ratio of the depth of the trench to the width of the trench ranges from 1:1 to 5:1.

In a possible implementation of the first aspect, the trench gate power MOSFET further includes: an oxide is formed on the inner surface of the trench.

In a possible implementation of the first aspect, the trench gate power MOSFET further includes: the filler includes polysilicon.

In a possible implementation of the first aspect, the trench gate power MOSFET further includes: the first ions include aluminum ions, and the first ions are implanted at least twice, that is, implanted into the bottom region of the trench along the C-axis direction of the silicon carbide crystal with a first dose and a first energy, and a second dose and a second energy respectively.

According to a second aspect, the present invention further provides a method for manufacturing a trench gate power MOSFET, where the trench gate power MOSFET is generated in a wafer, including:
  growing an epitaxial layer having a first conductivity type on a wide bandgap semiconductor material substrate;
  forming a body region having a second conductivity type on the epitaxial layer;

forming a trench in the body region by etching, where the length direction of the trench is parallel to a projection, on the surface of the wafer, of a crystallographic direction with the most obvious channel effect among all crystallographic directions of the wafer;

implanting first ions into a bottom region of the trench along the crystallographic direction with the most obvious channel effect of the wide bandgap semiconductor material to form a second conductivity-type pillar, where the bottom region of the trench is located below the trench, and is connected to the bottom of the trench, and the longitudinal depth of the second conductivity-type pillar is not less than 50% of the thickness of the epitaxial layer located in the bottom region of the trench; and filling the trench with a filler to fill the trench.

In a possible implementation of the second aspect, the manufacturing method further includes: the forming a trench in the body region by etching includes: implanting first ions into the body region and the epitaxial layer to form a connector having the second conductivity type, one end of the connector is electrically connected to the body region, the other end of the connector is electrically connected to the second conductivity-type pillar, and the depth of the connector is greater than or equal to the depth of the trench.

In a possible implementation of the second aspect, the manufacturing method further includes: the wide bandgap semiconductor material is silicon carbide; the crystallographic direction with the most obvious channel effect is the C-axis direction of the silicon carbide crystal.

In a possible implementation of the second aspect, the manufacturing method further includes: the silicon carbide includes 4H—SIC or 6H—SIC.

In a possible implementation of the second aspect, the manufacturing method further includes: the step of implanting first ions into a bottom region of the trench along the crystallographic direction with the most obvious channel effect of the wide bandgap semiconductor material includes:

implanting the first ions at least twice, that is, implanting the first ions into the bottom region of the trench along the C-axis direction of the silicon carbide crystal with a first dose and a first energy, and a second dose and a second energy respectively.

In a possible implementation of the second aspect, the manufacturing method further includes: the first dose is 5E13 to 5E14 atoms per square centimeter, and the first energy is 500 kev to 1500 kev; the second dose is 5E12 to 5E13 atoms per square centimeter, and the second energy is 50 kev to 300 kev.

In a possible implementation of the second aspect, the manufacturing method further includes: the epitaxial layer includes a first epitaxial layer and a second epitaxial layer, where the first epitaxial layer having the first conductivity type is grown on the wide bandgap semiconductor material substrate, and the second epitaxial layer having the first conductivity type is grown on the first epitaxial layer.

In a possible implementation of the second aspect, the manufacturing method further includes: the thickness of the first epitaxial layer is less than the thickness of the second epitaxial layer; the doping concentration of the first epitaxial layer is less than the doping concentration of the second epitaxial layer.

In a possible implementation of the second aspect, the manufacturing method further includes: the bottom of the trench and the second conductivity-type pillar are located in the second epitaxial layer, and the longitudinal depth of the second conductivity-type pillar is not less than 50% of the thickness of the second epitaxial layer located in the bottom region of the trench.

In a possible implementation of the second aspect, the manufacturing method further includes: the ratio of the depth of the trench to the width of the trench ranges from 1:1 to 5:1.

In a possible implementation of the second aspect, the manufacturing method further includes: the step of filling the trench with a filler to fill the trench includes:

after oxide is formed on the inner surface of the trench, filling the trench with a filler.

In a possible implementation of the second aspect, the manufacturing method further includes: the filler includes polysilicon.

In a possible implementation of the second aspect, the manufacturing method further includes: the first ions include aluminum ions.

Compared with the trench-type super junction MOSFET of the prior art, for the trench gate power MOSFET in the present invention, a second conductivity-type pillar is introduced under the trench, such as a deep P pillar, which not only protects the bottom of the trench, but also acts as a p-pillar at the super junction and can balance the charge. At the same time, the specific on-resistance Rsp is reduced, so that the chip area and the parasitic capacitance of the power MOSFET, as well as the switching loss of the power MOSFET during power conversion are reduced.

According to the manufacturing method of the present invention, the deep P pillar is formed by high-energy ion implantation. Different from the prior art, ion implantation is performed along the normal direction of the wafer. In the manufacturing method of the present invention, ion implantation is performed along a specific crystallographic direction of the semiconductor material (in the case of a silicon carbide wafer, implantation is performed along its c-axis), the channel effect of the crystal is utilized, under the same implantation depth, the implantation energy ranges from tens of Kev to more than one thousand Kev, and the implantation energy can be greatly reduced compared with the prior art, so that the manufacturing cost is greatly reduced, and it is easier to control the manufacturing process.

In addition, in the present invention, the length direction of the trench is set to be parallel to the projection of the specific crystallographic direction on the wafer surface, so that a symmetrical P pillar structure can be formed. As known to the person skilled in the art, the structure of the super junction requires a symmetrical P-pillar structure, and an asymmetrical structure causes uneven electric field distribution. Consequently, local breakdown of the MOSFET device is easily caused, and the voltage resistance of the device is reduced.

DETAILED DESCRIPTION OF EMBODIMENTS

Illustrative embodiments of the present application include, but are not limited to, a trench gate power MOSFET and a manufacturing method therefor.

The exemplary embodiments are described in detail herein, and examples thereof are shown in the accompanying drawings. When the following description involves the drawings, unless otherwise indicated, the same numbers in different drawings indicate the same or similar elements. The implementations described in the following exemplary embodiments do not represent all implementations consistent with the present application. Rather, the implementations are merely examples of devices and methods consistent with some aspects of the present application as detailed in the appended claims.

The terms used in the present application are only for the purpose of describing specific embodiments, and are not intended to limit the present application. The singular forms of "a", "said" and "the" used in the present application and the appended claims are also intended to include plural forms, unless the context clearly indicates other meanings. It should further be understood that the term "and/or" as used herein refers to and includes any or all possible combinations of one or more associated listed items. "Include" or "comprising" and other similar words mean that the elements or objects appearing before "include" or "comprising" include the elements or objects listed after "include" or "comprising" and their equivalents, and do not exclude other elements or objects. "Connect" or "connected" and other similar words are not limited to physical or mechanical connections, but may include electrical connections, whether direct or indirect.

It should be understood that although the terms first, second, third, etc. may be used in the present application to describe various information, the information should not be limited to these terms. These terms are only used to distinguish the same type of information from each other. For example, without departing from the scope of the present application, the first information may also be referred to as second information, and similarly, the second information may also be referred to as first information. Depending on the context, the word "if" as used herein can be interpreted as "when" or "while" or "in response to determining".

The embodiments of the present application are described in further detail below with reference to the accompanying drawings.

Figure 1:
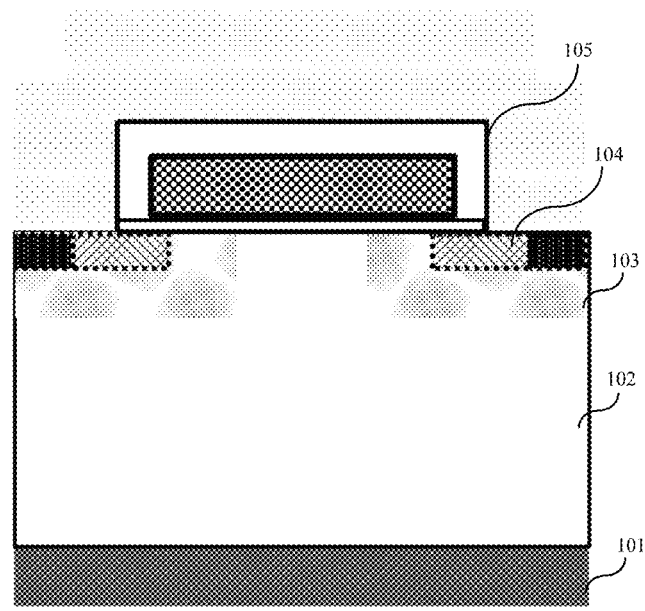
FIG. 1 is a schematic structural diagram of a planar-structure power MOSFET manufactured by a conventional process.

FIG. 1 is a schematic structural diagram (cross-sectional view) of a planar-structure MOSFET manufactured by the conventional process. The MOSFET shown in FIG. 1 includes a heavily doped N-type substrate 101, a lightly doped N-type epitaxial layer 102 formed on the substrate 101, a P-type body region 103 formed on the epitaxial layer 102, a source 104 located in the P-type body region 103, and a polysilicon gate 105 located on the P-type body region 103. The gate, the source, and drain of a planar MOSFET are all in the same plane, and therefore can be integrated in a plane, but there are large restrictions on the size of the planar MOSFET, and the performance is not good enough.

Figure 2:
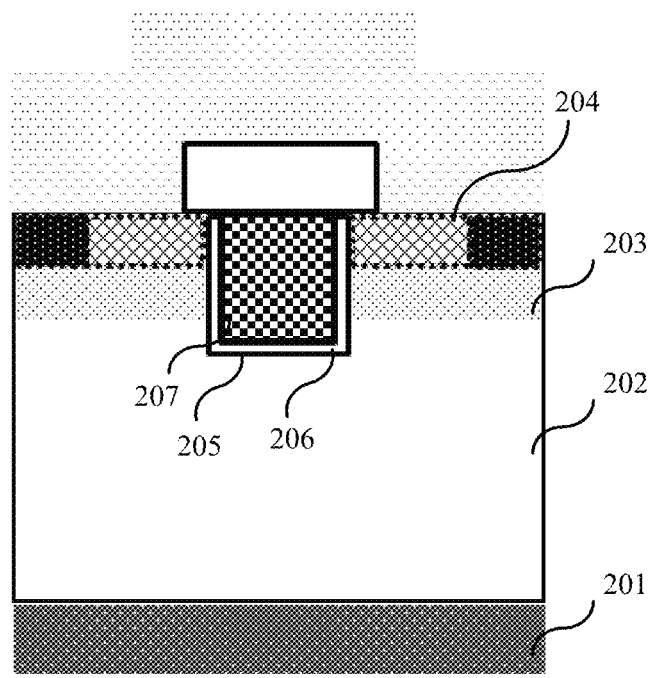
FIG. 2 is a schematic structural diagram of a trench-type power MOSFET manufactured by a conventional process.

FIG. 2 is a schematic structural diagram (cross-sectional view) of a trench-type MOSFET manufactured by the conventional process. The MOSFET shown in FIG. 2 includes a heavily doped N-type substrate 201, a lightly doped N-type epitaxial layer 202 formed on the substrate 201, a P-type body region 203 formed on the epitaxial layer 202, a source 204 located in the P-type body region 203, a trench 205 formed by etching in the P-type body region 203, a gate oxide film 206 grown on the inner wall of the trench 205, and polysilicon 207 deposited on the gate oxide film 206. Compared with the planar MOSFET shown in FIG. 1, the trench MOSFET shown in FIG. 2 does not have a JFET region, and vertical trenches on the sidewalls of the trench can reduce the trench spacing. However, because the critical electric field of a wide bandgap semiconductor such as silicon carbide is 10 times that of silicon, the electric field strength in the bottom region of the trench is relatively large. This high electric field in the semiconductor causes a high electric field to be generated on the trench oxide, thereby causing reliability problems of the device.

Figure 3:
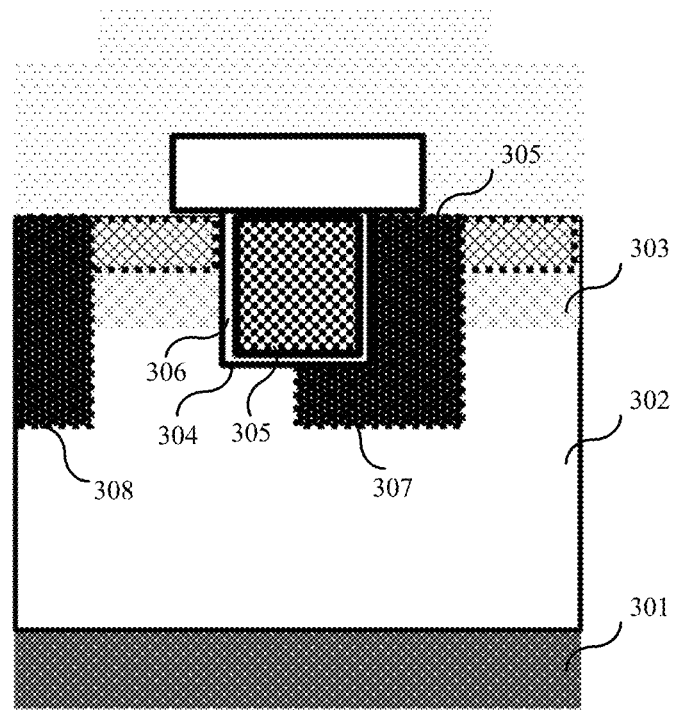
FIG. 3 is a schematic structural diagram of a trench-type power MOSFET manufactured by Infineon.

FIG. 3 is a schematic structural diagram (cross-sectional view) of a trench-type MOSFET of Infineon. The MOSFET shown in FIG. 3 includes a heavily doped N-type substrate 301, a lightly doped N-type epitaxial layer 302 formed on the substrate 301, a P-type body region 303 formed on the epitaxial layer 302, a trench 304 formed by etching in the P-type body region 303, a gate oxide film 306 grown on the inner wall of the trench 304, and polysilicon 305 deposited on the gate oxide film 306. Compared with the trench-type MOSFET shown in FIG. 2, the trench-type MOSFET shown in FIG. 3 further includes a heavily doped first P-type region 307 and a second P-type region 308 below the trench 304 to reduce the high electric field at the bottom of the trench 304, and the longitudinal depth of the P-type region is greater than the longitudinal depth of the P-type body region.

Figure 4:
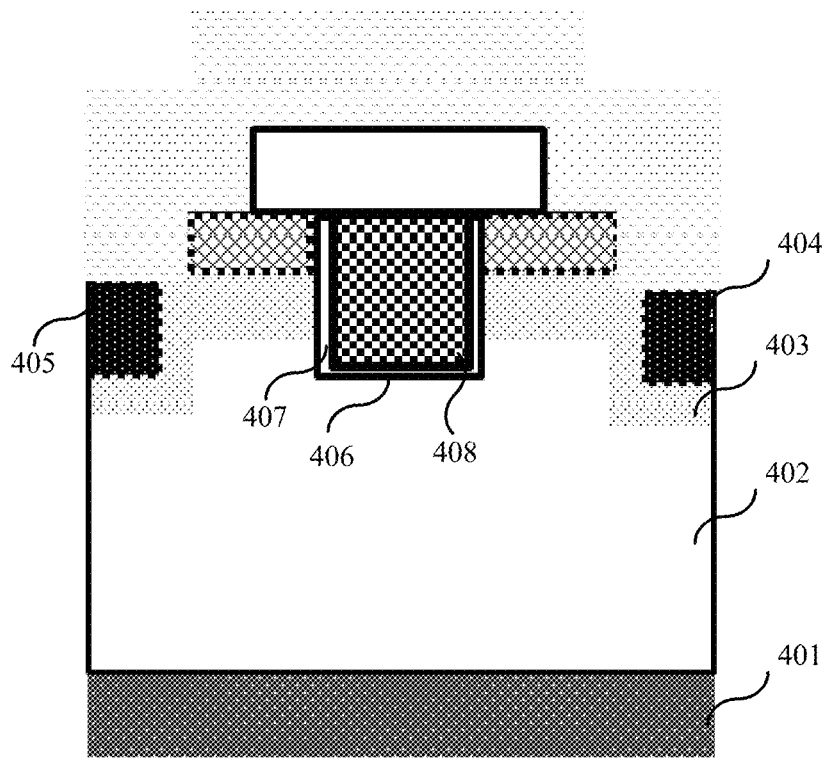
FIG. 4 is a schematic structural diagram of a trench-type power MOSFET manufactured by Rohm.

FIG. 4 is a schematic structural diagram (cross-sectional view) of a trench-type MOSFET of Rohm. The MOSFET shown in FIG. 4 includes a heavily doped N-type substrate 401, a lightly doped N-type epitaxial layer 402 formed on the substrate 401, a P-type body region 403 formed on the epitaxial layer 402, a trench 406 formed by etching in the P-type body region 403, a gate oxide film 407 grown on the inner wall of the trench 406, and polysilicon 408 deposited on the gate oxide film 407. Compared with the trench-type MOSFET shown in FIG. 2, the trench-type MOSFET shown in FIG. 4 further includes a heavily doped first P-type region 404 and a second P-type region 405 below the trench 406, to reduce the high electric field at the bottom of the trench 406, and the first P-type region 404 and the second P-type region 405 are respectively located on both sides of the trench 406, and the longitudinal depths of the first P-type region 404 and the second P-type region 405 are less than the longitudinal depth of the P-type body region in which the first P-type region 404 and the second P-type region 405 are located. However, the trench-type MOSFET structure shown in FIGS. 3 and 4 has high manufacturing costs and is difficult to control in the process.

For the trench-type MOSFET device, the source-drain on-resistance $Rds_{(on)}$ consists of the following components:

$$Rds_{(on)} = R_N + R_{CH} + R_D + R_{sub}$$

$R_{N+}$ is the resistance of the source N+ diffusion region. Because the doping concentration of the N+ region is high, the resistance is very small. Therefore, this part of the resistance is negligible compared with other resistances that make up the drain-source on-resistance $Rds_{(on)}$.

$R_{CH}$ is the trench resistance, that is, the trench resistance under the gate. $R_{CH}$ is an important parameter that makes up the drain-source on-resistance $Rds_{(on)}$. Changes in a ratio of the width to the length of the trench, a gate oxide thickness, and a gate voltage can all affect the change of $R_{CH}$.

$R_D$ is the drift region resistance, that is, the resistance of the epitaxial layer. The epitaxial layer is a high-resistance layer grown on the substrate to withstand high voltage. Under the action of external voltage, carriers drift in the drift region. For high-voltage MOSFET devices, the drift region resistance is the most important factor in determining the drain-source on-resistance $Rds_{(on)}$. Therefore, the source-drain on-resistance $Rds_{(on)}$ can be reduced by reducing the drift region resistance $R_D$.

$R_{sub}$ is the wafer substrate resistance, and this resistance value can be reduced by processes such as backside thinning.

Under the same breakdown voltage, because the specific on-resistance $R_{sp}$=drain-source on-resistance $Rds_{(on)}$*effective area of the chip, for the same drain-source on-resistance $Rds_{(on)}$, the smaller the specific on-resistance $R_{sp}$, the smaller the effective area of the chip, and thus the lower the parasitic capacitance of the power MOSFET, so that the switching loss of the power MOSFET during power conversion can be reduced.

Figure 5:
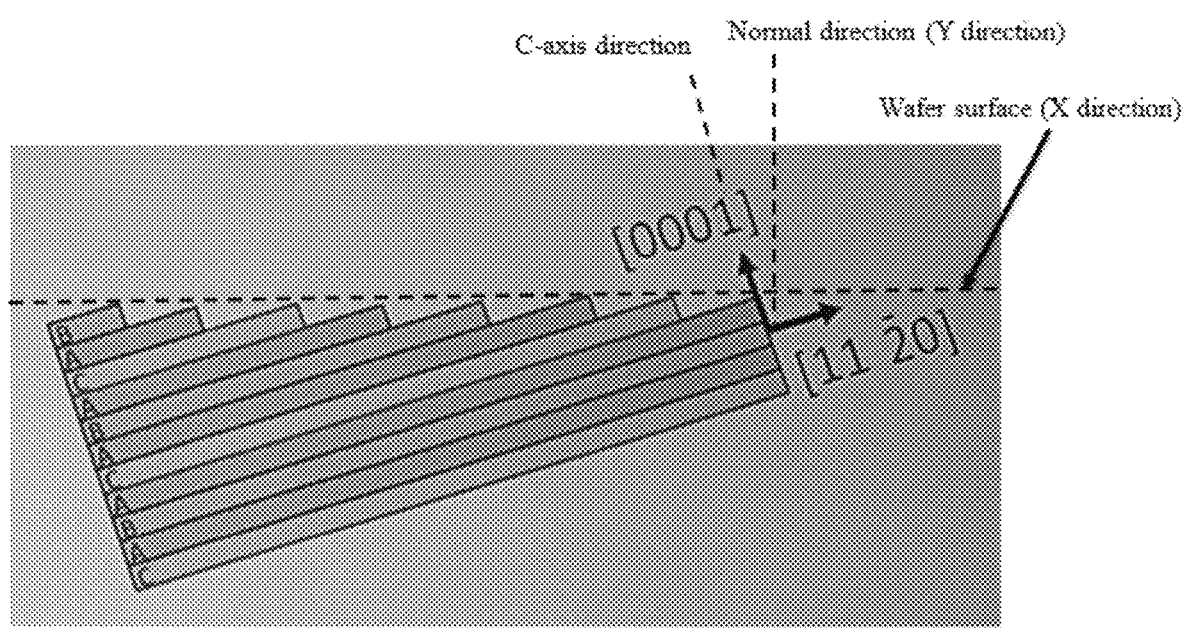
FIG. 5 is a schematic diagram of an angle relationship between a common silicon carbide crystal and a surface of a silicon carbide wafer in the silicon carbide wafer.

FIG. 5 is a schematic diagram of an angle relationship between a common silicon carbide crystal and a surface of a silicon carbide wafer in the silicon carbide wafer, that is, an angle relationship between a microscopic crystal and a macroscopic wafer. The X direction of the wafer surface and the Y direction perpendicular to the wafer surface (that is, the normal direction), as well as two mutually perpendicular crystallographic directions [001] and [11 $\overline{2}$ 0] of the silicon carbide (4H—SiC) crystal are shown in the figure. As is known to all, from a microscopic perspective, a crystal is a structure composed of a large number of microscopic material units (such as atoms, ions, and molecules) arranged in an orderly manner according to certain rules. Therefore, the crystal usually has a specific shape. According to different shapes, the crystal axis, crystallographic direction, and crystal plane of the crystal can be defined. For example, at least two crystallographic directions of a silicon carbide (4H—SiC) crystal are defined as shown in the figure: the C-axis direction (that is, the [0001] direction) and the [11 $\overline{2}$ 0] direction. In the semiconductor industry, in order to make the crystal growth more stable during the production process, when cutting the wafer, the crystallographic direction shown in FIG. 5 is usually selected, that is, there is an angle between the axial direction (C axis) of the crystal and the normal direction (Y direction) of the wafer surface, and the angle is usually 4°; in addition, a projection of one crystallographic direction of the crystal, that is, the [11 $\overline{2}$ 0] direction on the wafer surface coincides with the X direction of the wafer. However, in production practice, sometimes for convenience, the angle is also ignored, and the crystallographic direction and mirror surface are directly used to refer to the direction of the wafer surface.

Figure 6:
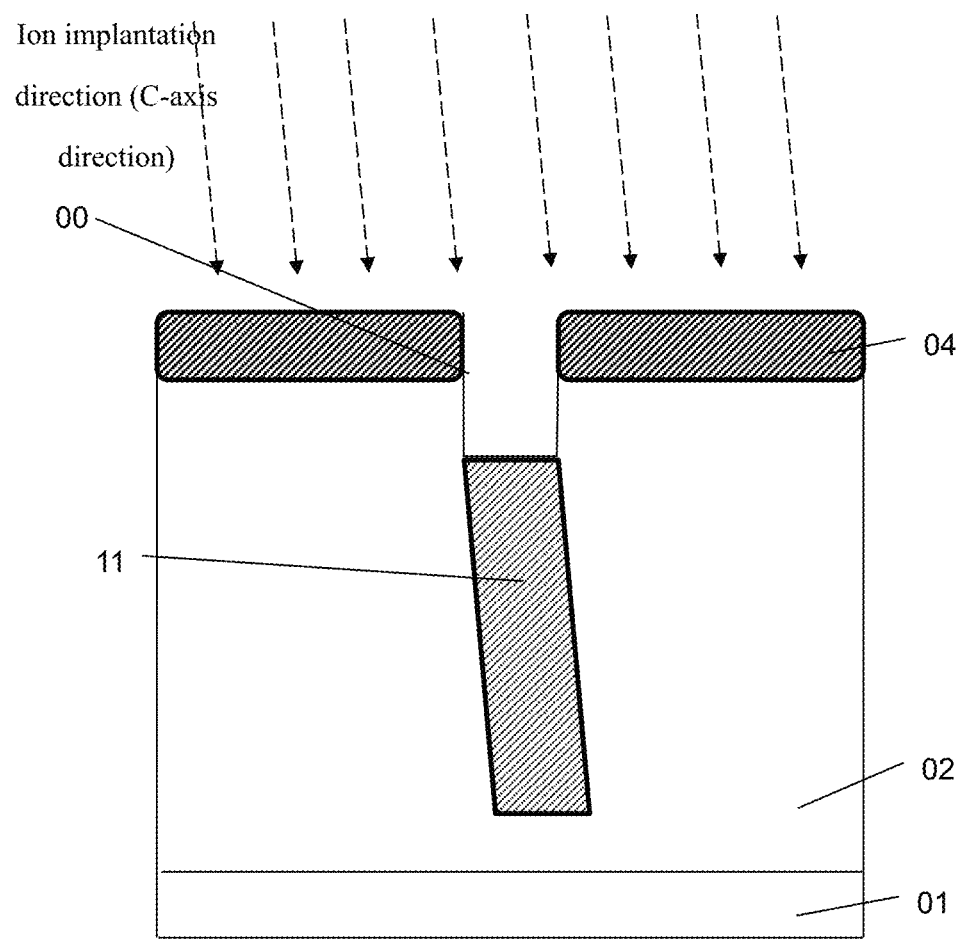
FIG. 6 is a schematic structural diagram of a trench-type power MOSFET with a non-axisymmetric P pillar obtained by ion implantation along the C axis when the silicon carbide wafer is cut in the direction shown in FIG. 5.

FIG. 6 is a schematic structural diagram (cross-sectional view) of a trench-type power MOSFET with a non-axisymmetric P pillar obtained by ion implantation along the C axis when the silicon carbide wafer is cut in the direction shown in FIG. 5. The trench-type power MOSFET shown in the figure includes a substrate 01, an epitaxial layer 02 formed on the substrate 01 by a process such as epitaxial growth, a P-type body region 04 formed on the epitaxial layer 02, and a trench 00 that penetrates the P-type body region 04 and that deeply extends into the epitaxial layer 02. The P pillar is located below the trench 00, buried in the epitaxial layer 02, and is usually formed by ion implantation. In order to utilize the channel effect, the crystallographic direction with the most obvious channel effect is usually selected as the direction of ion implantation. In the silicon carbide (4H—SiC) crystal, the direction of the C axis is the crystallographic direction with the most obvious channel effect. According to the schematic diagram of FIG. 5, the C axis of silicon carbide is not perpendicular to the surface of the wafer, that is, in the structure shown in FIG. 6, the P pillar 11 formed by ion implantation cannot be perpendicular to the surface of the wafer. That is, in the cross-sectional view of a unit cell as shown in FIG. 6, the P pillar 11 cannot be symmetrical about the central axis of the unit cell. As a common sense in the art, the person skilled in the art should know that, in the cross-sectional view shown in FIG. 6, when the shape of the P pillar is an axisymmetric figure, the performance of the MOSFET device is the best. However, the cross-sectional view of the P pillar 11 obtained by ion implantation according to the prior art is a parallelogram as shown in FIG. 6, which is asymmetrical about the central axis of the unit cell, and this easily leads to a low breakdown voltage of the MOSFET device.

Figure 7:
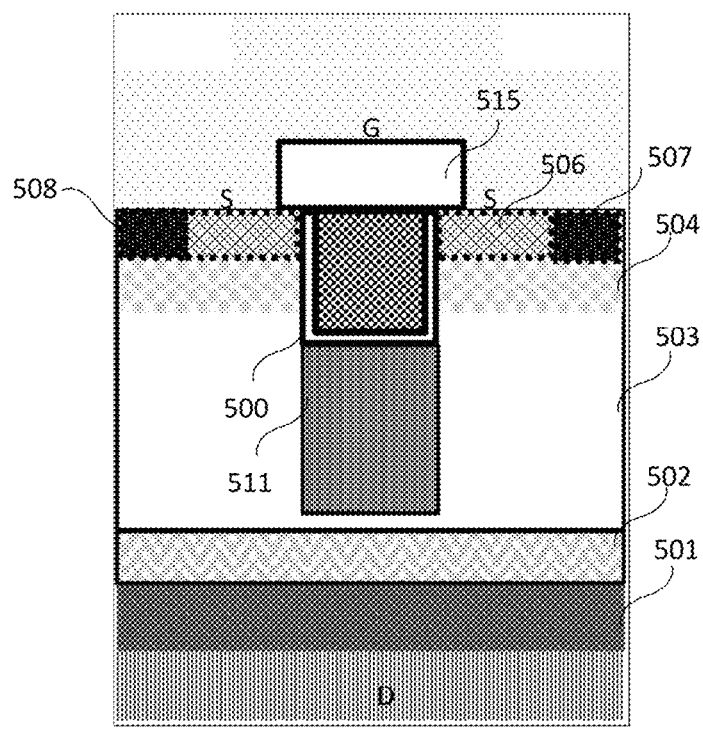
FIG. 7 is a schematic diagram of a cross section of a trench gate power MOSFET structure according to some embodiments of the present application.
Figure 8A:
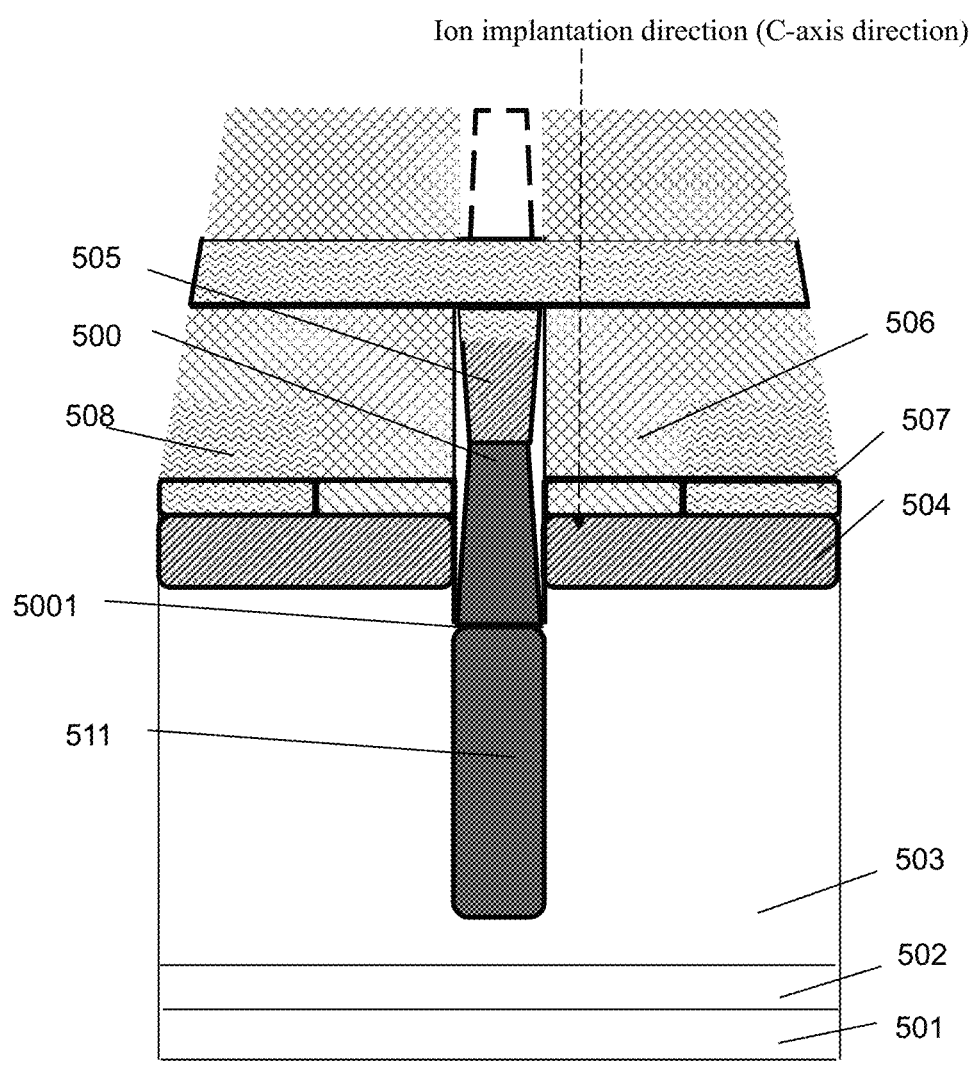
FIG. 8a is a stereoscopic schematic diagram of the schematic diagram shown in FIG. 7 at a 45° top view according to some embodiments of the present application.
Figure 8B:
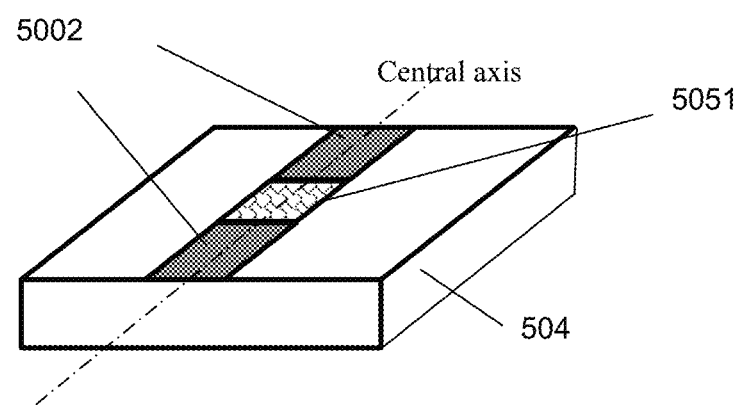
FIG. 8b is a schematic diagram of a mask pattern of a P-pillar connector in FIG. 8a during the manufacturing process.

In order to solve the defects, the present invention proposes a new structure of a trench gate power MOSFET, which is described below with reference to FIGS. 7, 8a, and 8b. FIG. 7 is a schematic diagram of a cross section of a trench gate power MOSFET structure according to some embodiments of the present application. FIG. 8a is a three-dimensional schematic diagram of the MOSFET shown in FIG. 7 at a 45° top view according to some embodiments of the present application. FIG. 8b is a schematic diagram of a mask pattern of a P-pillar connector 505 in FIG. 8a during the manufacturing process.

It should be noted that the trench gate power MOSFET provided by the present invention includes a power MOSFET having a trench gate and super junction (or quasi-super junction) structure. In the following example, a wide bandgap semiconductor substrate is a silicon carbide material, the first conductivity type is N-type, the second conductivity type is P-type, the second conductivity-type pillar is a P pillar, and the first ion is an aluminum ion, and the structure and formation process of the trench gate power MOSFET of the present application are specifically described.

As shown in FIG. 7, a substrate 501 is a substrate of a wide bandgap semiconductor having a first conductivity type. For example, the substrate 501 can be a heavily doped N-type silicon carbide substrate. Lightly doped N-type first epitaxial layer 502 and second epitaxial layer 503 are sequentially grown on the substrate 501 by an epitaxial growth process. The first epitaxial layer 502 is located below the second epitaxial layer 503, the thickness of the first epitaxial layer 502 is less than the thickness of the second epitaxial layer 503, and the doping concentration of the first epitaxial layer 502 is less than the doping concentration of the second epitaxial layer 503. In one embodiment, the N-type doping concentration of the first epitaxial layer 502 is between 1E14 atoms/cm$^2$ (atoms per square centimeter) and 2E16 atoms/cm$^2$, and the thickness of the first epitaxial layer 502 is between 0.2 μm and 40 μm; the N-type doping concentration of the second epitaxial layer 503 is between 2E15 atoms/cm$^2$ and 2E17 atoms/cm$^2$, and the thickness of the second epitaxial layer 503 is between 2 μm and 200 μm. It can be understood that the thickness and doping concentration of the first epitaxial layer 502 and the thickness and doping concentration of the second epitaxial layer 503 can be determined according to the withstand voltage rating required by the device. In this embodiment, the two epitaxial layers with different doping concentrations can be used to form a quasi-super junction device to enhance avalanche tolerance.

It can be understood that in the embodiment shown in FIG. 7, the wide bandgap semiconductor substrate is a silicon carbide material, which is exemplary and not restrictive. In other embodiments of the present application, the wide bandgap semiconductor substrate can further be other wide bandgap semiconductor materials, such as gallium nitride and aluminum nitride. However, for the present invention, the difference in selecting different substrate materials is that different trench setting directions and ion implantation directions are selected based on the different crystal orientations of different wafers (bodies).

It can be understood that the impurities doped in the N-type doped first epitaxial layer 502 and the second epitaxial layer 503 can be nitrogen or phosphorus, or other N-type impurities.

A P body region 504 is located above the second epitaxial layer 503, and can be formed by implanting ions of a conductivity type different from the substrate 501, the first epitaxial layer 502 and the second epitaxial layer 503, such as P-type ions, into the upper end of the second epitaxial layer 503.

A P-pillar connector 505 is formed in the P body region 504 (P body region) and the second epitaxial layer 503 by an ion implantation process. Specifically, a mask pattern 5051 indicating the P-pillar connector 505 is first formed on the upper surface of the P body region 504 by a photolithography mask process, as shown in FIG. 8b. The mask pattern is symmetrical about the central axis of the upper surface of the P body region 504 (see FIG. 8b). Then, P-type impurities are implanted in the region toward the P body region 504 and the second epitaxial layer 503 by an ion implantation process, thereby forming a columnar P-pillar connector 505. The connection between the P-pillar 511 and the P-body region 504 is implemented by using the P-pillar connector 505, so that the P-pillar 511 generated in the subsequent steps is electrically connected to the P-body region 504, and electrically floating does not occur in any working state. In other words, the depth of the P-pillar connector 505 needs to start from the upper surface of the P-body region 504 and extend deeply into the second epitaxial layer 503. In this way, when the processing of the trench gate power MOSFET is complete, the P-pillar 511 buried in the second epitaxial layer 503 can be electrically connected to the horizontal (referring to the horizontal in FIGS. 7, 8a, and 8b) P-body region 504 through the vertical (referring to the vertical in FIGS. 7 and 8a, 8b) P-pillar connector 505.

The ions are continuously implanted above the P-body region 504 (including the P-pillar connector 505) to form an ohmic contact resistance portion. For example, N-type heavily doped impurities are implanted into the middle section of the P body region 504, that is, the portion including the P-pillar connector 505, to obtain a N-type heavily doped region 506, that is, the portion marked as S in FIG. 7, so as to form a lower source ohmic contact resistance. For another example, P-type heavily doped impurities are implanted into the two ends of the P body region 504, that is, the positions connected to the two ends of the N-type heavily doped region 506, to obtain a first P-type heavily doped region 507 and a second P-type heavily doped region 508, so as to form a lower P body (that is, the P body region 504) ohmic contact resistance.

As shown in FIG. 8b, a hard mask layer pattern 5002 for processing a trench 500 is formed on both sides of the central axis of the surface of the P body region 504. The mask pattern is discontinuous along the central axis, but is complementary to a mask pattern 5051 of the P-pillar connector 505. When etching is subsequently performed according to the hard mask pattern, the P body region 504 and a part of the second epitaxial layer 503 under the hard mask layer pattern 5002 of the trench 500 are etched away to form the trench 500, while the P-pillar connector 505 under the mask pattern 5051 of the P-pillar connector 505 is retained as a conductor for electrical connection between the P pillar 511 and the P body region 504. In some embodiments, the composition of the hard mask layer may be silicon dioxide or nickel. It is understood that in other embodiments, the composition of the hard mask layer may be other elements or compounds.

Specifically, as shown in FIG. 8a, the bottom 5001 of the trench 500 is located in the second epitaxial layer 503. The ratio of the depth to the width of the trench 500 may range from 1:1 to 5:1. For example, the width of the trench 500 is 0.4 μm and the depth is 1.2 μm. In some embodiments, the ratio of the depth to the width of the trench 500 is 3:1. It is understood that in the illustrated embodiment, the width and the depth of the trench 500 are exemplary and not restrictive. In other embodiments of the present application, the width and the depth of the trench 500 may be other values.

The direction of the trench 500 is further illustrated below with reference to FIGS. 9a and 9b.

Figure 9A:
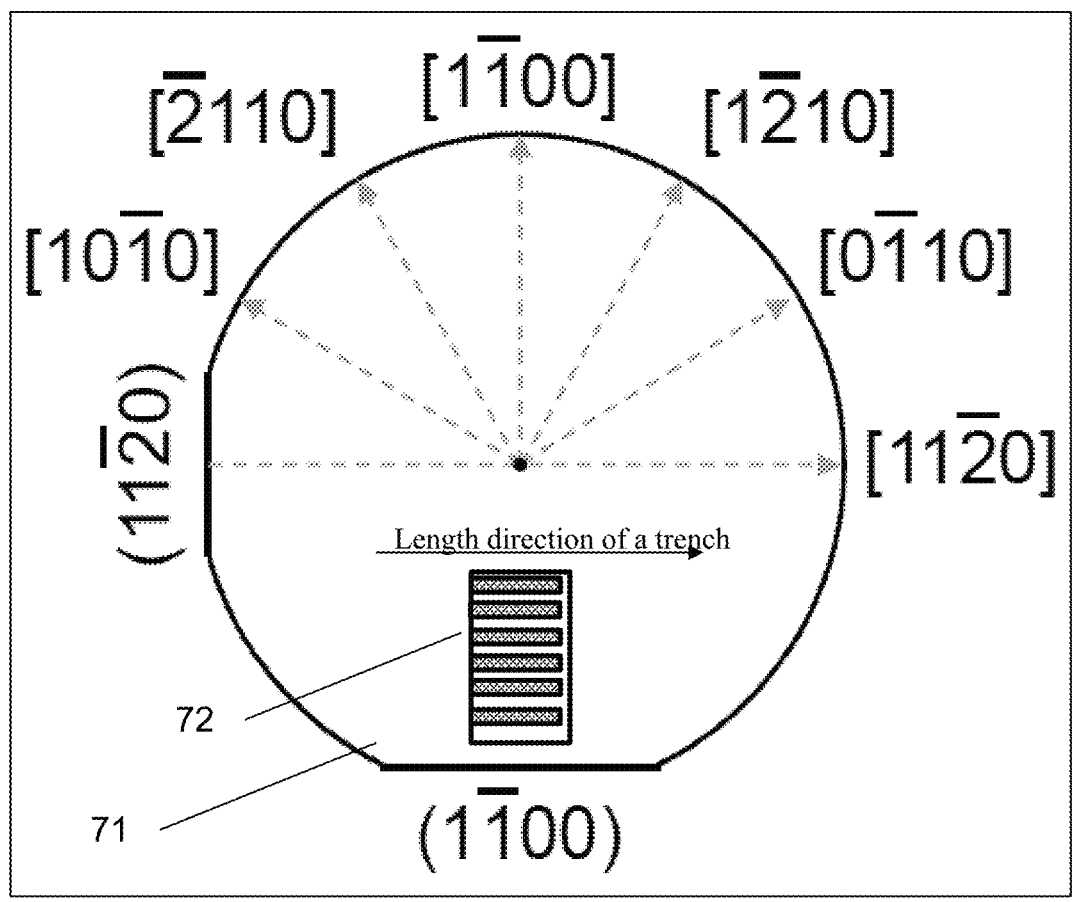
FIG. 9a is a setting direction of a trench of a trench gate power MOSFET according to some embodiments of the present application.
Figure 9B:
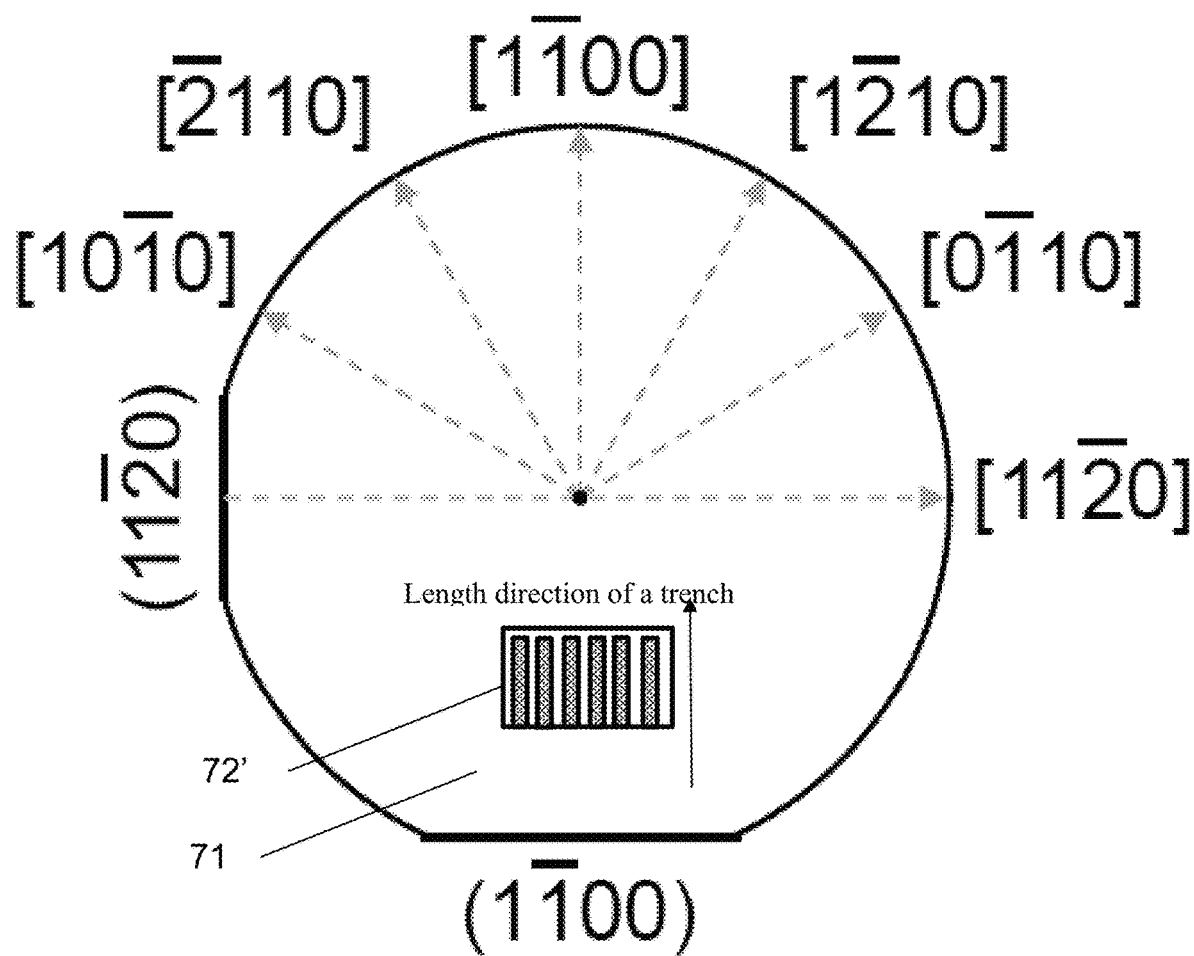
FIG. 9b is a setting direction of a trench according to the prior art.

A first pattern 72 and a second pattern 72' in FIGS. 9a and 9b are used to illustrate the positional relationship between the trench and the wafer 71. In the first pattern 72 and the second pattern 72', the shaded part is used to illustrate the trench 500, especially to illustrate the relationship between the length direction of the trench 500 and the crystal plane of the wafer 71. The surface of the wafer 71 shows multiple crystallographic directions (shown in square brackets) and crystal planes (shown in round brackets). According to the above description, it can be learned that, the surface of the silicon carbide wafer and the axial direction of the silicon carbide crystal are not at right angles. The directions of the wafer surface in the figure are actually the projections of the crystallographic directions of the silicon carbide crystal on the wafer surface. For ease of description in the industry, the crystallographic directions of the crystal are usually used to refer to the directions of the wafer surface.

Many trenches 500 can be formed by etching on a wafer 71, and the directions of these trenches are the same. In the prior art, the trench is formed by etching in the direction shown in FIG. 9b by default, that is, the length direction of the trench is perpendicular to the crystal plane (1 $\overline{1}$ 00), as shown in the second pattern 72' in FIG. 9b. After analysis by the researchers of the present invention, such a trench direction is the fundamental reason for the appearance of the parallelogram P pillar shown in FIG. 6.

Therefore, in the present invention, the default trench setting direction in the industry is adjusted, so that the length direction of the trench is parallel to a projection of a selected crystallographic direction of a wafer (crystal) on the wafer surface. Because the C axis is both a crystallographic direction with an obvious channel effect and a crystallographic direction with the smallest deviation angle from the wafer normal in the current SiC wafer manufacturing method, the trench setting direction of the present application needs to ensure that the length direction of the trench is parallel to the plane formed by the C axis and the wafer normal, so that the implantation along the C axis does not cause a shielding effect due to the influence of the trench sidewall and the mask. Specifically, according to the embodiment of the present application, the selected crystallographic direction is the crystallographic direction with the most obvious channel effect among all crystallographic directions of the wafer, that is, the direction in which the greatest depth that can be achieved during ion implantation. For example, as shown in the first pattern 72 in FIG. 9a, the projection direction of the C axis on the wafer surface is selected. This change is conducive to the formation of symmetrical P pillars during subsequent ion implantation. For example, in FIG. 9a, the symmetrical P pillars 511 are formed when ions are implanted along the C axis (penetrating the paper plane and towards the outside). For a specific analysis, please refer to the description of FIG. 10 later.

Return to FIG. 8a. According to the ion implantation direction shown in the figure, that is, the C axis direction of silicon carbide, ions are implanted into the bottom of the trench 500, and a P pillar 511 with a symmetrical cross-sectional shape can be obtained. In some embodiments, aluminum ions (for example, Al-27) are implanted into the bottom region of the trench 500 along the C-axis direction of silicon carbide (for 4H—SIC, the angle between the ion implantation direction and the normal direction of the 4H—SIC wafer is 4 degrees) with a first energy of 500 kev to 1500 kev and a first dose of 5E13 atoms/cm$^2$ to 5E14 atoms/cm$^2$, and a second energy of 50 kev to 300 kev and a second dose of 5E12 atoms/cm$^2$ to 5E13 atoms/cm$^2$, to implement deep uniform doping in silicon carbide to form a P pillar 511. Due to the trench effect, aluminum ions can be implanted to a sufficient depth to obtain a sufficiently deep P pillar 511, so that the number of ion implantations and implantation energy are greatly reduced, and manufacturing costs are reduced. The depth of the P pillar 511 is not less than 50% of the thickness of the second epitaxial layer 503 located below the bottom of the trench 500, the P pillar 511 is located in the second epitaxial layer 503, and the P pillar 511 and the N-type lightly doped second epitaxial layer 503 form a quasi-super junction structure. In this way, the P pillar 511 and the P body region 504 are connected in the width direction.

In another embodiment, the P-pillar connector 505 can also be formed by implanting ions into the sidewalls of the trench 500 after the trench 500 is formed by etching.

Figure 8C:
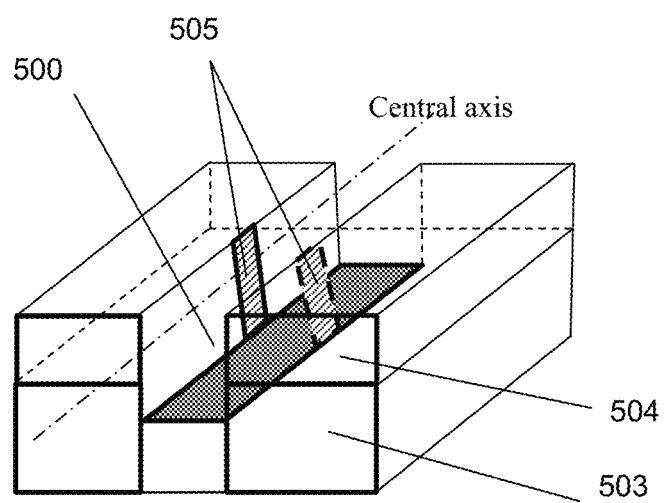
FIG. 8c is a schematic diagram of another P-pillar connector according to some other embodiments of the present application.

Referring to FIG. 8c, the trench 500 is formed by continuously etching along the central axis of the unit cell, rather than by intermittently etching as shown in FIG. 8b. The etching depth penetrates the P-body region 504 and reaches the second epitaxial layer 503. After the trench 500 is formed, ions are implanted into the sidewalls of the trench 500, so as to form P-pillar connectors 505 with a certain thickness on both sidewalls. The depth of these P-pillar connectors 505 is at least the same as the depth of the trench 500, so that the P-pillar connectors 505 can be electrically connected to the subsequently generated P-pillars 511 (the P-pillars 511 are generated at the bottom of the trench 500 by an ion implantation process and are connected to the bottom of the trench 500). At the same time, because a portion of the P-pillar connector 505 is generated in the P-body region 504, the electrical connection between the P-body region 504 and the P-pillar 511 can be effectively implemented by using the P-pillar connector 505.

Figure 10:
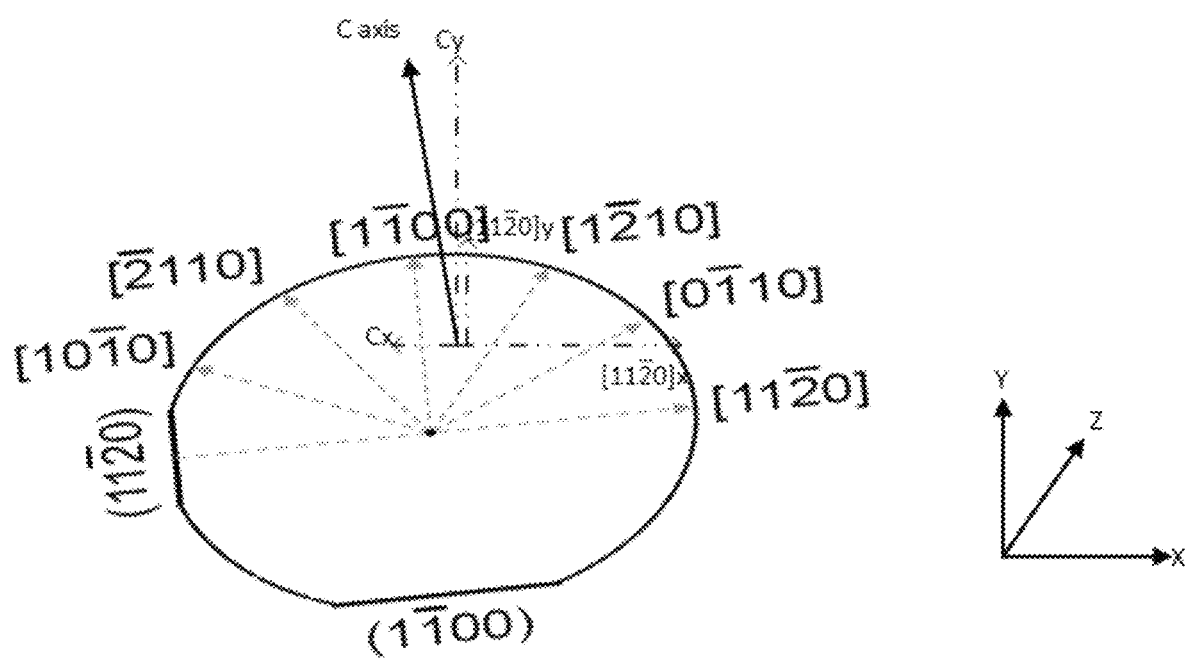
FIG. 10 is a schematic diagram of a relationship between the C axis of a silicon carbide crystal in a trench gate power MOSFET structure and the coordinate system of a wafer surface according to some embodiments of the present application.

FIG. 10 is a schematic diagram of the XYZ coordinate system on the upper surface of the wafer, in which the X direction and the Y direction are parallel to the wafer surface, and the Z direction is perpendicular to the wafer surface. At the same time, FIG. 10 further shows multiple crystallographic directions and crystal planes of the silicon carbide crystal. The crystallographic direction schematic diagram is slightly deflected to show that there is an angle between the crystal and the wafer. Combined with the cutting method of the silicon carbide wafer shown in FIG. 5, it can be learned that a crystal plane (1 $\overline{1}$ 00) of silicon carbide is parallel to the XY plane, a projection [11 $\overline{2}$ 0]x of a crystallographic direction [11 $\overline{2}$ 0] on the wafer surface is parallel to the X axis, and a projection Cy of the C axis on the YZ plane is parallel to the Y axis. As mentioned above, there is an angle between the crystal and the wafer, and the angle is about 4°. Due to the existence of this angle, when the length direction of the trench is perpendicular to the XY plane, that is, when the length direction of the trench is parallel to the Z axis (as shown in FIG. 9b), only a non-axisymmetric P pillar that is approximately parallelogram can be formed in the bottom region of the trench by the ions implanted into the bottom of the trench along the C axis. As mentioned above, the preferred scheme of the P pillar is a symmetrical (axisymmetric) figure. More hidden dangers are brought by the P pillar with a parallelogram cross section, and device breakdown, failure, etc. are easily caused.

In the present invention, the default trench direction in the industry is rotated by 90°, so that the length direction of the trench is shown in FIG. 9a, that is, the length direction of the trench is parallel to the X axis. According to the above analysis, the ions implanted along the C axis can be understood as being implanted along the Y axis (that is, the Cy direction perpendicular to the wafer) and along the X axis (that is, the [11 $\overline{2}$ 0]x direction parallel to the wafer). The X direction is the length direction of the trench, and the implantation of ions along this direction does not affect the cross-sectional shape of the P pillar 511 in the width direction of the trench 500. Therefore, in this embodiment, the range of ion implantation does not exceed the expected range. From the cross section shown in FIG. 8a, the P pillar 511 can form a symmetrical approximately rectangular structure. Compared with the prior art shown in FIG. 9b, the stability and reliability of the trench MOSFET can be improved in the present invention.

Compared with the planar-structure MOSFET produced by the conventional process shown in FIG. 1, the withstand voltage can be improved by the trench-type MOSFET of the present application. In addition, the doping concentration of the second epitaxial layer 503 can be reduced by the sufficiently deep P pillar 511, and the drift region resistance $R_D$ can be reduced, so that the on-resistance $Rds_{(on)}$ is reduced.

It can be understood that the implantation times, and corresponding energies and dose values of aluminum ions (such as Al-27) implanted into silicon carbide are exemplary and not restrictive. In other embodiments of the present application, the implantation times, corresponding energies and doses can be selected according to the required implantation depth.

It can be understood that the implantation of aluminum ions (such as Al-27) from the C-axis direction of the 4H—SIC wafer here is exemplary and not restrictive. In other embodiments of the present application, other ions whose conductivity type is P-type can be implanted into the second epitaxial layer along the crystallographic direction of another wide bandgap semiconductor, to implement a greater implantation depth with lower implantation energy by utilizing the crystal trench effect.

After that, after the ions implanted into the second epitaxial layer 503 are activated by high-temperature annealing, and silicon dioxide is formed on the inner surface of the trench 500, polysilicon is deposited into the trench 500 to form a polysilicon gate, a silicon dioxide insulating layer 515 is grown on the polysilicon gate, and steps such as the conventional ohmic contact process and the metallization process are performed to form electrodes (source S and gate G). The structure of the power MOSFET with a trench gate quasi-super junction structure finally formed in the present application is shown in FIG. 7.

The embodiment of the present application further provides a power MOSFET with a trench gate super junction structure (not shown), and the structure and preparation method of with a trench gate super junction structure are similar to the power MOSFET with a trench gate quasi-super junction structure described above. Compared with the power MOSFET with a trench gate quasi-super junction structure, the only difference is as follows: Only a single epitaxial layer is needed by the MOSFET with a trench gate super junction structure during the preparation process, and the depth of the P pillar formed therein is not less than 50% of the thickness of the epitaxial layer located in the region below the bottom of the trench, so that the P pillar and the epitaxial layer form a super junction structure. For a detailed description, please refer to the above content. Details are not repeated herein.

Figure 11:
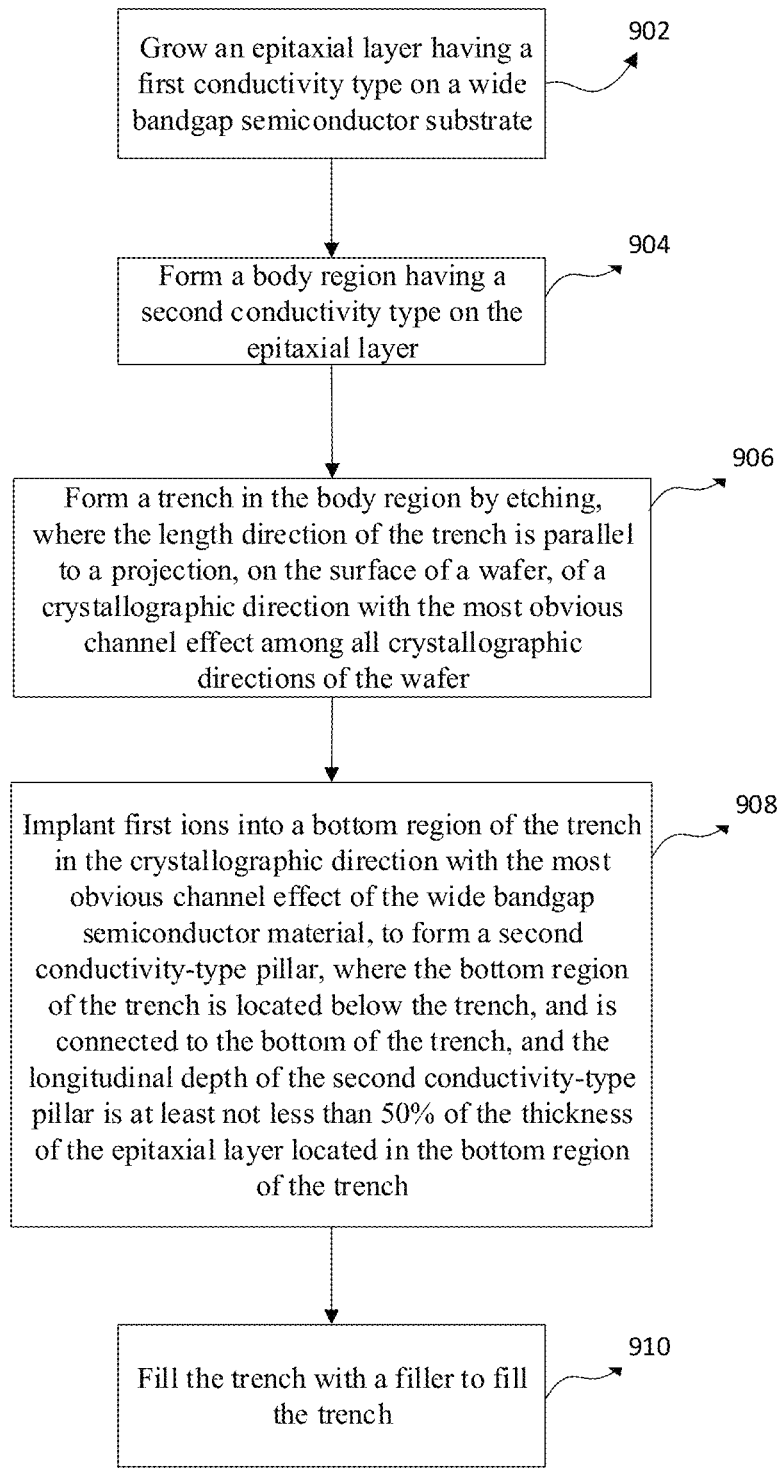
FIG. 11 is a flow chart of a method for manufacturing a trench gate power MOSFET according to some embodiments of the present application.

FIG. 11 is a schematic flow diagram of a method for manufacturing a trench gate power MOSFET according to some embodiments of the present application. Specifically, as shown in FIG. 11, the method for manufacturing a trench gate power MOSFET of the present application includes the following steps:

1) Grow an epitaxial layer having a first conductivity type on a wide bandgap semiconductor substrate (902). The material of the wide bandgap semiconductor substrate may be silicon carbide, gallium nitride, aluminum nitride, diamond, etc. The epitaxial layer may be formed on the wide bandgap semiconductor substrate by an epitaxial growth process. The epitaxial layer of the first conductivity type is an epitaxial layer doped with a first conductivity type element. In some embodiments, the first conductivity type element may be an element such as nitrogen and phosphorus, so that the epitaxial layer is an N-type semiconductor (free electrons are majority carriers, and holes are minority carriers). In some embodiments, the first conductivity type element may be a trivalent element such as boron and aluminum, so that the epitaxial layer is a P-type semiconductor (holes are majority carriers, and free electrons are minority carriers). It can be understood that whether the first conductivity type is P-type or N-type can be selected according to actual needs. This is not limited herein.

2) Form a body region having a second conductivity type on the epitaxial layer (904). The body region of a second conductivity type is a body region doped with a second conductivity type element. The second conductivity type is different from the first conductivity type. For example, if the first conductivity type is N-type, the second conductivity type is P-type; if the first conductivity type is P-type, the second conductivity type is N-type. It can be understood that the first conductivity type and the second conductivity type can be determined according to actual needs. This is not limited herein.

In some embodiments, the second conductivity type element can be implanted into the epitaxial layer by an ion implantation process to form a body region of a second conductivity type.

3) Form a trench in the body region by etching (906). In order to obtain a second conductivity-type pillar with cross-sectional symmetry in the subsequent ion implantation, the ion implantation direction can be matched with the direction of the trench. The matching can include that the ion implantation direction is perpendicular to the bottom surface of the trench, and can include that the ion implantation direction can be decomposed into: a direction perpendicular to the bottom surface of the trench and a direction parallel to the length direction of the trench. Based on the ion implantation direction, the crystallographic direction with the most obvious channel effect is usually selected. If the crystallographic direction with the most obvious channel effect is perpendicular to the wafer surface, the trench can be set arbitrarily on the wafer surface, and the ion implantation direction can always enter the bottom of the trench vertically; if the crystallographic direction with the most obvious channel effect is not perpendicular to the wafer surface, the crystallographic direction with the most obvious channel effect can be decomposed into an X direction parallel to the wafer surface and a Y direction perpendicular to the wafer surface, and the length direction of the trench can be set to a direction parallel to the X direction.

For example, in some embodiments, the length direction of the trench is set to a direction perpendicular to the crystal plane (11 $\bar{2}$ 0) of the wafer 71 as shown in FIG. 9a, that is, the length direction of the trench is parallel to the crystallographic direction [11 $\bar{2}$ 0] (or more accurately, parallel to a projection of the crystallographic direction [11 $\bar{2}$ 0] on the wafer), but is not set to the direction shown in FIG. 9b. Furthermore, in order to keep the subsequently formed P pillar 511 electrically connected to the P body region 504, a P-pillar connector 505 can be formed between the bottom 5001 of the trench 500 and the P body region 504 by ion implantation.

There are two ways to form the P-pillar connector 505.

First, the P-pillar connector 505 is formed first. This can be understood with reference to FIGS. 8a and 8b. After forming a body region having a second conductivity type, such as the P body region 504, a region of a mask pattern 5051 of the P-pillar connector 505 as shown in the figure is prepared on both sides of the central axis (as shown in FIG. 8b) of the upper surface of the P body region 504, and then in this region, P-type ions are implanted into the P body region 504 and the second epitaxial layer 503 to obtain the P-pillar connector 505. The depth of ion implantation should be greater than the depth of the trench 500, that is, the depth should reach the region of the P pillar 511, so that the electrical connection between the P body region 504 and the P pillar 511 formed in the subsequent process can be implemented by using the P-pillar connector 505. Then, the trench 500 is formed in the P body region 504 and the second epitaxial layer 503 by etching according to the region of the hard mask layer pattern 5002 for processing the trench shown in FIG. 8b, and the depth and width of the trench can be controlled. It can be understood by the person skilled in the art that the position of the mask pattern 5051 of the P-pillar connector 505 shown in FIG. 8b can be located at any position of the central axis, or there can be multiple mask patterns 5051 in a unit cell, and similar settings are not described herein.

In some embodiments, the body region can be etched by a dry etching technology to form a trench. In some embodiments, the body region can be etched by a wet etching technology to form a trench. It can be understood that the trench can be formed by dry etching or wet etching according to an actual situation. This is not limited herein.

Furthermore, in order to ensure the effective electrical connection between the P body region 504 and the P pillar 511, P-type ion implantation can be added to the side wall near the P-pillar connector 505, so that the P-pillar connector 505 is fully connected to the P body region 504, thereby forming an effective P-type connection, and avoiding the electrical floating of the P pillar 511 formed in the subsequent process.

In other embodiments, after further forming the first P-type heavily doped region 507, the second P-type heavily doped region 508, and the N-type heavily doped region 506, a region of the P-pillar connector 505 can be circled on both sides of the central axis of the device surface by means of a mask (referring to FIG. 8a), and then an ion implantation process is performed to form the P-pillar connector 505 in the P body region 504 and the second epitaxial layer 503.

Second, the P-pillar connector 505 is formed later. It can be understood by referring to FIG. 8a and FIG. 8c. Compared with a case in which the trench 500 is discontinuous, a continuous trench 500 can be formed by forming the P-pillar connector 505 later. That is, in the embodiment shown in FIG. 8c, there is no P-pillar connector across the trench 500, and the complexity of trench etching can be slightly reduced. After forming a body region having a second conductivity type, such as a P-body region 504, a trench 500 as shown in the figure is formed in the P-body region 504 and the second epitaxial layer 503 by etching according to a conventional process, and then ion implantation is performed on the sidewalls on both sides of the trench 500 to form a P-ion heavily doped region of a certain thickness on the sidewalls, to form a group of P-pillar connectors 505. In other words, it can be understood that the P-pillar connector manufactured by the previous method is embedded in the two side walls of the trench 500. Similarly, in order to ensure effective electrical connection between the P-body region 504 and the P-pillar 511, ion implantation can be performed downward at the connection between the P-pillar connector 505 and the bottom of the trench 500, so that the P-pillar connector 505 and the P-pillar 511 formed in the subsequent process can be more reliably electrically connected.

As is well known in the art, the P pillar is preferably symmetrical in shape, while an asymmetrical P pillar is not conducive to reducing the electric field strength in the super junction, and excessive electric field strength can easily lead to device breakdown. Therefore, in the present application, the industry practice is broken, and a trench is formed by etching in the [11 $\overline{2}$ 0]x direction (see FIG. 10). Combined with the description of FIG. 7 and FIGS. 8a, 8b, and 8c, it can be learned that the P pillar 511 is a rectangular structure arranged below the trench 500 and matching the shape and size of the trench 500. Only when the length direction of the trench 500 is parallel to the [11 $\overline{2}$ 0] direction, the projection of the C-axis direction of silicon carbide (4H—SiC) on the wafer surface is the [11 $\overline{2}$ 0]x direction, and then when the subsequent step of ion implantation is performed, the cross section of the obtained P pillar is a symmetrical quasi-rectangle, rather than a P pillar with a cross section of a quasi-parallelogram as in some prior arts.

4) Implant first ions into a bottom region of the trench along the crystallographic direction of the wide bandgap semiconductor material to form a second conductivity-type pillar, where the bottom region of the trench is located below the trench and connected to the bottom of the trench, and the selection of the crystallographic direction should enable the implantation of the first ions to fully utilize the crystal trench effect (908). In this way, when the first ions are implanted along the crystallographic direction of the semiconductor, due to the trench effect, the range of the first ions is significantly increased compared with the implantation in the random direction or along the normal direction of the wafer, and a stronger penetration effect is provided, so that the implantation energy of the first ions can be greatly reduced, and manufacturing costs can be reduced. In some embodiments, the wide bandgap semiconductor material is a hexagonal crystal system wide bandgap semiconductor material (such as silicon carbide and gallium nitride), and the crystallographic direction refers to the vertical crystal plane (that is, the C-axis direction) of the hexagonal crystal system wide bandgap semiconductor material. In some embodiments, if the wide bandgap semiconductor material is silicon carbide, the crystallographic direction of the wide bandgap semiconductor material is selected as the C-axis direction of silicon carbide, and the C-axis direction is at a certain angle to the normal direction of the silicon carbide wafer. In some embodiments, if the wide bandgap semiconductor material is 4H—SIC or 6H—SiC, the angle between the C-axis direction and the normal direction of the 4H—SIC or 6H—SiC wafer is 4 degrees. It can be understood that for other types of silicon carbide wafers, the angle between the corresponding C-axis direction and the normal direction of the corresponding wafer can be other values. This is not limited herein.

The longitudinal depth of the second conductivity-type pillar is at least not less than 50% of the thickness of the epitaxial layer located in the bottom region of the trench. In some embodiments, the epitaxial layer is a single epitaxial layer, and the longitudinal depth of the second conductivity-type pillar is at least not less than 50% of the thickness of the epitaxial layer located in the bottom region of the trench. In some embodiments, the epitaxial layer includes a first epitaxial layer and a second epitaxial layer, and the first epitaxial layer is located below the second epitaxial layer; the bottom of the trench and the second conductivity-type pillar are located in the second epitaxial layer, and the longitudinal depth of the second conductivity-type pillar is at least not less than 50% of the thickness of the second epitaxial layer located in the bottom region of the trench.

5) Fill the trench with a filler to fill the trench (910). In some embodiments, after an oxide (such as silicon dioxide) is formed on the inner surface of the trench, a filler can be filled into the trench. The filling of the filler into the trench can be polysilicon deposition into the trench.

In one embodiment, a trench silicon carbide MOSFET with a spacing of 2.4 µm is designed by using TCAD (a semiconductor process/device simulation tool), and the specific on-resistance Rsp can reach 0.2 ohms per square centimeter. Considering the trench mobility and the thickness of the silicon carbide substrate (assuming that the thickness of the silicon carbide substrate is 180 um), the specific on-resistance Rsp of the device is corrected to 0.896 ohms per square centimeter, and the breakdown voltage of the device is 950V (rated voltage is 750V or 650V). The silicon carbide super junction MOSFET has a typical static output capacitance Coss curve. When the drain-source voltage Vds increases, the static output capacitance Coss decreases significantly. This characteristic makes the curve integral Qoss of the static output capacitance Coss smaller (favorable for soft switching), and makes the power consumption generated by the static output capacitance Coss smaller (favorable for hard switching). Compared with silicon carbide devices or silicon devices prepared by conventional processes in related technologies, the MOSFET with trench gate and super junction (or quasi-super junction) structures prepared by the preparation method of the power MOSFET with trench gate and super junction (or quasi-super junction) structures of the present application can have a thinner epitaxial layer, lower specific on-resistance, and high device stability at the same breakdown voltage.

In addition, in a comparative experimental example, taking the implantation of P-type impurities Al-27 into a 2e16 cm-3 silicon carbide epitaxial layer as an example, the conventional process of the power MOSFET in the prior art is experimentally compared with the method of the present application. When the total impurity dose is selected as 1E14 per square centimeter. Al-27 is implanted under the energy condition of 500 Kev by the manufacturing method of the present invention, while the implantation is performed under the energy condition of 3.3 Mev by the manufacturing method of the prior art. The two manufacturing methods are compared, and a greater depth of the second conductivity-type pillar that can be achieved by the technical solution of the present invention. It can be learned that the manufacturing method of the present invention can achieve the implantation depth with much lower implantation energy compared with high energy conditions in the prior art, and it is easier to control the manufacturing process under low implantation energy conditions.

It should be noted that in the examples and descriptions of this patent, relative terms such as first and second are only used to distinguish one entity or operation from another entity or operation, and do not necessarily require or imply there is no such actual relationship or sequence between these entities or operations. Moreover, the terms "include", "comprise", or their any other variant is intended to cover a non-exclusive inclusion, so that a process, a method, an article, or a device that includes a list of elements not only includes those elements but also includes other elements which are not expressly listed, or further includes elements inherent to such process, method, article, or device. An element preceded by "includes a . . . " does not, without more constraints, preclude the existence of additional identical elements in the process, method, article, or device that includes the element.

Although the present application has been shown and described with reference to certain preferred embodiments of the present application, the person skilled in the art should understand that various changes in form and details may be made therein without departing from the spirit and scope of the application.

The invention claimed is:

1. A trench gate power MOSFET, wherein the trench gate power MOSFET is formed in a wafer, comprising:
   a substrate, wherein the substrate is a substrate of a hexagonal wide bandgap semiconductor material having a first conductivity type;
   an epitaxial layer, wherein the epitaxial layer is grown on the substrate and has the first conductivity type;
   a body region, wherein the body region is formed on the epitaxial layer and has a second conductivity type;
   a trench, wherein the trench is formed in the body region by etching, the length direction of the trench is parallel to a projection, on the surface of the wafer, of the C axis;
   a second conductivity-type pillar, wherein the second conductivity-type pillar is formed by implanting first ions into a bottom region of the trench along the C axis of the hexagonal wide bandgap semiconductor material, the bottom region of the trench is located below the trench, and is connected to the bottom of the trench, and the longitudinal depth of the second conductivity-type pillar is not less than 50% of the thickness of the epitaxial layer located in the bottom region of the trench; and
   a trench gate, wherein the trench gate is formed by filling the trench with a filler.

2. The trench gate power MOSFET according to claim 1, wherein a connector having the second conductivity type is further provided between the second conductivity-type pillar and the body region, one end of the connector is electrically connected to the body region, and the other end of the connector is electrically connected to the second conductivity-type pillar.

3. The trench gate power MOSFET according to claim 1, further comprising: a drain located below the substrate, a gate located on the central axis of the body region, and a source located on both sides of the gate.

4. The trench gate power MOSFET according to claim 1, wherein the epitaxial layer is a single epitaxial layer.

5. The trench gate power MOSFET according to claim 4, wherein the hexagonal wide bandgap semiconductor material is silicon carbide.

6. The trench gate power MOSFET according to claim 5, wherein the first ions comprise aluminum ions, and the first ions are implanted at least twice, that is, implanted into the bottom region of the trench along the C-axis direction of the silicon carbide crystal with a first dose and a first energy, and a second dose and a second energy.

7. The trench gate power MOSFET according to claim 1, wherein the epitaxial layer comprises a first epitaxial layer and a second epitaxial layer, and the first epitaxial layer is located below the second epitaxial layer; the thickness of the first epitaxial layer is less than the thickness of the second epitaxial layer; the doping concentration of the first epitaxial layer is less than the doping concentration of the second epitaxial layer; the bottom of the trench and the second conductivity-type pillar are located in the second epitaxial layer, and the longitudinal depth of the second conductivity-type pillar is not less than 50% of the thickness of the second epitaxial layer located in the bottom region of the trench.

8. The trench gate power MOSFET according to claim 1, wherein the ratio of the depth of the trench to the width of the trench ranges from 1:1 to 5:1.

9. A method for manufacturing a trench gate power MOSFET, wherein the trench gate power MOSFET is generated in a wafer, comprising:

growing an epitaxial layer having a first conductivity type on a hexagonal wide bandgap semiconductor material substrate;

forming a body region having a second conductivity type on the epitaxial layer;

forming a trench in the body region by etching, wherein the length direction of the trench is parallel to a projection, on the surface of the wafer, of the C axis;

implanting first ions into a bottom region of the trench along the C axis of the hexagonal wide bandgap semiconductor material to form a second conductivity-type pillar, wherein the bottom region of the trench is located below the trench, and is connected to the bottom of the trench, and the longitudinal depth of the second conductivity-type pillar is not less than 50% of the thickness of the epitaxial layer located in the bottom region of the trench; and filling the trench with a filler to fill the trench.

10. The manufacturing method according to claim 9, further comprising: implanting first ions into the body region and the epitaxial layer to form a connector having the second conductivity type, one end of the connector is electrically connected to the body region, the other end of the connector is electrically connected to the second conductivity-type pillar, and the depth of the connector is greater than or equal to the depth of the trench.

11. The manufacturing method according to claim 9, wherein the hexagonal wide bandgap semiconductor material is silicon carbide.

12. The manufacturing method according to claim 11, wherein the step of implanting the first ion into the bottom region of the trench along the C axis comprises:

implanting the first ion at least twice, that is, implanting the first ion into the bottom region of the trench along the C axis direction of the silicon carbide crystal with a first dose and a first energy and a second dose and a second energy respectively.

13. The manufacturing method according to claim 12, wherein the first dose is 5E13 to 5E14 atoms per square centimeter, and the first energy is 500 kev to 1500 kev; the second dose is 5E12 to 5E13 atoms per square centimeter, and the second energy is 50 kev to 300 kev.

14. The manufacturing method according to claim 9, wherein the epitaxial layer comprises a first epitaxial layer and a second epitaxial layer, wherein the first epitaxial layer having the first conductivity type is grown on the hexagonal wide bandgap semiconductor material substrate, and the second epitaxial layer having the first conductivity type is grown on the first epitaxial layer.

15. The manufacturing method according to claim 14, wherein the thickness of the first epitaxial layer is less than the thickness of the second epitaxial layer; the doping concentration of the first epitaxial layer is less than the doping concentration of the second epitaxial layer.

16. The manufacturing method according to claim 14, wherein the bottom of the trench and the second conductivity-type pillar are located in the second epitaxial layer, and the longitudinal depth of the second conductivity-type pillar is not less than 50% of the thickness of the second epitaxial layer located in the bottom region of the trench.

17. The manufacturing method according to claim 9, wherein the ratio of the depth of the trench to the width of the trench ranges from 1:1 to 5:1.

* * * * *